United States Patent
Hawker et al.

(10) Patent No.: US 6,685,983 B2
(45) Date of Patent: Feb. 3, 2004

(54) DEFECT-FREE DIELECTRIC COATINGS AND PREPARATION THEREOF USING POLYMERIC NITROGENOUS POROGENS

(75) Inventors: Craig Jon Hawker, Los Gatos, CA (US); James Lupton Hedrick, Pleasanton, PA (US); Elbert Emin Huang, Valhalla, NY (US); Victor Yee-Way Lee, San Jose, CA (US); Teddie Magbitang, Sunnyvale, CA (US); David Mecerreyes, Santa Cruz, CA (US); Robert Dennis Miller, San Jose, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 09/808,724

(22) Filed: Mar. 14, 2001

(65) Prior Publication Data

US 2002/0131246 A1 Sep. 19, 2002

(51) Int. Cl.[7] ................................. B05D 3/02
(52) U.S. Cl. ................... 427/96; 427/227; 427/243; 427/387
(58) Field of Search .................. 428/304.4, 314.4; 427/96, 226, 227, 243, 245, 387

(56) References Cited

U.S. PATENT DOCUMENTS

| | | |
|---|---|---|
| 5,103,288 A | 4/1992 | Sakamoto et al. |
| 5,308,749 A | 5/1994 | Sutton et al. |
| 5,384,376 A | 1/1995 | Tunney et al. |
| 5,767,014 A | 6/1998 | Hawker et al. |
| 5,776,990 A | 7/1998 | Hedrick et al. |
| 5,858,871 A | 1/1999 | Jeng |
| 5,883,219 A | 3/1999 | Carter et al. |
| 5,895,263 A | 4/1999 | Carter et al. |
| 5,953,627 A | 9/1999 | Carter et al. |
| 6,093,636 A | 7/2000 | Carter et al. |
| 6,107,357 A | 8/2000 | Hawker et al. |
| 6,143,643 A | 11/2000 | Carter et al. |
| 6,177,360 B1 | 1/2001 | Carter et al. |
| 6,271,273 B1 * | 8/2001 | You et al. ............. 521/61 |
| 6,342,454 B1 * | 1/2002 | Hawker et al. ...... 438/780 |
| 6,391,932 B1 * | 5/2002 | Gore et al. .......... 521/61 |

FOREIGN PATENT DOCUMENTS

| | | | |
|---|---|---|---|
| EP | 1088848 | * | 4/2001 |
| JP | 11-217458 | * | 8/1999 |
| WO | WO 99/03926 | * | 1/1999 |
| WO | WO 00/31183 | * | 6/2000 |
| WO | WO 01/86709 | * | 11/2001 |

OTHER PUBLICATIONS

Nguyen et al, Polymer Preprints, 49(1), pp 398–399, 1999.*
Yang et al, Polymeric Materials Science and Engineering, 85, pp 18–19, 2001.*

(List continued on next page.)

Primary Examiner—Erma Cameron
(74) Attorney, Agent, or Firm—Reed & Eherle LLP

(57) ABSTRACT

Defect-free dielectric coatings comprised of porous polymeric matrices are prepared using nitrogen-containing polymers as pore-generating agents. The dielectric coatings are useful in a number of contexts, including the manufacture of electronic devices such as integrated circuit devices and integrated circuit packaging devices. The dielectric coatings are prepared by admixing, in a solvent, a polymeric nitrogenous porogen with a high temperature, thermosetting host polymer miscible therewith, coating a substrate surface with the admixture, heating the uncured coating to cure the host polymer and provide a vitrified, two-phase matrix, and then decomposing the porogen. The dielectric coatings so prepared have few if any defects, and depending on the amount and molecular weight of porogen used, can be prepared so as to have an exceptionally low dielectric constant on the order of 2.5 or less, preferably less than about 2.0. Integrated circuit devices and integrated circuit packaging devices manufactured so as to contain the dielectric material of the invention are provided as well.

34 Claims, 6 Drawing Sheets

OTHER PUBLICATIONS

Uedono et al, J of Applied Physics, 90(5), pp 2498–2503, 2001.*

Kim et al, Molecular Crystals and Liquid Crystals, 370, pp 301–304, 2001.*

U.S. patent application Ser. No. 09/441,730, Hawker et al., filed Nov. 16, 1999.

U.S. patent application Ser. No. 09/808,726, Hawker et al., filed Mar. 14, 2001.

Baney et al. (1995), "Silsesquioxanes", *Chemical Reviews* 95(5):1409–1430.

Hawker et al. (2000), "Supramolecular Approaches to Nanoscale Dielectric Foams for Advanced Microelectronic Devices," *MRS Bulletin*, pp. 54–58.

Hedrick et al. (1993), "High Temperature Polymer Foams," *Polymer* 34(22):4717–4726.

Hedrick et al. (1995), Polyimide Foams Derived From Poly(4,4'–Oxydiphenylpyromellitimide) and Poly(α–Methylstyrene), *High Perform. Polym.* 7:133–147.

Hedrick et al. (1995), "High Temperature Nanofoams Derived From Rigid and Semi–Rigid Polyimides," *Polymer* 36(14):2685–2697.

Hedrick et al. (1995), "The Use of Styrenic Copolymers to Generate Polyimide Nanofoams," *Polymer* 36(25):4855–4866.

Hedrick et al. (1995), "Polyimide Nanofoams Prepared From Styrenic Block Copolymers," *Microelectronics Technology, Polymers for Advanced Imaging and Packaging* ACS Symposium Series, ACS, Washington D.C., 614:425–438.

Hedrick et al. (1996), "High $T_g$ Polyimide Nanofoams Derived From Pyromellitic Dianhydride and 1,1–Bis(4–Aminophenyl)–1–Phenyl–2,2,2–Trifluoroethane," *Journal of Polymer Science: Part A: Polymer Chemistry* 34:2867–2877.

Hedrick et al. (1996), "Polyimide Foams Derived From a High $T_g$ Polyimide With Grafted Poly (α–methylstyrene)," *Polymer* 37(23):5229–5236.

Hedrick et al. (1996), "High–Temperature Polyimide Nanofoams for Microelectronic Applications," *Reactive & Functional Polymers* 30:43–53.

Hedrick et al. (1998), "Templating Nanoporosity in Thin–Film Dielectric Insulators," *Advanced Materials* 10(13):1049–1053.

Hedrick et al. (1998), "Templating Nanoporosity in Organosilicates Using Well–Defined Branched Macromolecules," *Organic/Inorganic Hybrid Materials*, Materials Research Society Symposium Proceedings 519:65–75.

Heise et al. (2000), "Starlike Polymeric Architectures by Atom Transfer Radical Polymerization: Templates for the Production of Low Dielectric Constant Thin Films," *Macromolecules* 33(7):2346–2354.

Mecerreyes et al. (2001), "A Novel Approach to Functionalized Nanoparticles: Self–Crosslinking of Macromolecules in Ultradilute Solution," *Advanced Materials* 13(3):204–208.

Miller et al. (1999), "Porous Organosilicates for On–Chip Dielectric Applications," *Mat. Res. Soc. Symp. Proc.* 555:3–15.

Miller et al. (2000), "Sacrificial Macromolecular Porogens: A Route to Porous Organosilicates for On–Chip Insulator Applications," *Advanced Metallization Conference 1999 (AMC 1999), Conference Proceedings ULSI XV*, pp. 327–333.

Nguyen et al. (1999), "Low–Dielectric, Nanoporous Organosilicate Films Prepared via Inorganic/Organic Polymer Hybrid Templates," *Chem. Mater.* 11(11):3080–3085.

Nguyen et al. (2000), "Hyperbranched Polyesters as Nanoporosity Templating Agents for Organosilicates," *Macromolecules* 33(11):4281–4284.

Peters (Sr. Ed.) (1998), "Pursuing the Perfect Low–k Dielectic," *Semiconductor International* 21(10):64–74.

Peters (Sr. Ed.) (1999), "Solving the Integration Challenges of Low–k Dielectrics," *Semiconductor International* 22(13):56–64.

Peters (Sr. Ed.) (2000), "Low–k Dielectrics: Will Spin–On or CVD Prevail?," *Semiconductor International* 23(6):108–124.

Remenar et al. (1998), "Templating Nanopores into Poly-(Methylsilsesquioxane): New Low–Dielectric Coatings Suitable for Microelectronic Applications," *Mat. Res. Soc. Symp. Proc.* 511:69–74.

St. Clair et al. (1988), "Low Dielectric Polymides for Electronic Applications," *Polymeric Materials Science and Engineering*, Proceedings of the ASC Division of Polymeric Materials: Science and Engineerings 59:28–32.

* cited by examiner

DEFECT-FREE DIELECTRIC COATINGS AND PREPARATION THEREOF USING POLYMERIC NITROGENOUS POROGENS

TECHNICAL FIELD

This invention relates generally to dielectric materials and their use in electronic devices such as integrated circuits. More particularly, the invention pertains to defect-free dielectric coatings and preparation thereof using nitrogen-containing polymers as pore-generating agents. The dielectric coatings so prepared are useful in a number of contexts, for example in electronic devices such as integrated circuit devices and integrated circuit packaging devices.

BACKGROUND

As semiconductor devices are becoming smaller and on-chip device density is correspondingly increasing, both signal delays due to capacitive coupling and crosstalk between closely spaced metal lines are increasing. These problems are exacerbated by the need to keep conductor lines as short as possible in order to minimize transmission delays, thus requiring multilevel wiring schemes for the chip. The problems have been ameliorated to some extent by the switch to copper metallurgy, but as feature sizes go below 0.25 µm, this alone will not provide a solution. The use of an insulator with a lower dielectric constant than the currently used $SiO_2$ (k=3.9–4.2) would also, clearly, improve the situation. Current integration demands for insulators used with, for example, Al(Cu) wiring, also require thermal stabilities in excess of 400° C., good mechanical properties, resistance to crack generation and propagation, low defect densities, low water uptake, chemical resistance, processability by photolithographic techniques and gas phase etching procedures, and capacity for planarization.

Accordingly, considerable attention has focused on the replacement of silicon dioxide with new materials, particularly materials having lower dielectric constants, since both capacitive delays and power consumption depend on the dielectric constant of the insulator. This is not a simple matter given the complexities and demands of current semiconductor integration processes. Of the existing materials with demonstrated ultra-low dielectric constants, the highly fluorinated materials (e.g., Teflon) have the longest history. For example, attempts have been made to reduce the dielectric constant of polyimides by incorporating perfluoroalkyl-containing comonomers into the polymer structure (see, e.g., Haidar et al. (1991) *Mater. Res. Soc. Symp. Proc.* 227:35; Critchlen et al. (1972) *J. Polym. Sci.* A-I10 1789; and Harris et al. (1991) *Mater. Res. Soc. Symp. Proc.* 227:3). The synthesis of polyimides based on 9,9-disubstituted xanthene dianhydrides, e.g., 6FXDA/6FDA (9,9-bis(trifluoromethoxy)xanthenetetracarboxylic dianhydride/2,2-bis(4-aminophenyl)-1,1,1,3,3,3-hexafluoropropane), as well as polyimides based on the TFMOB monomer (2,2'-bis(trifluoromethyl)benzidine), has been reported (see Muraka (March 1996) *Solid State Tech* 83 and Jang et al. (1994) *Mater. Res. Soc. Symp. Proc.* 337:25). Although fluorinated alkane polymers such as these have the lowest dielectric constants of any homogeneous polymers and substitution with fluorine decreases the dielectric constant of any polymer, there are many liabilities. Current integration requirements call for exceptional thermal stability at temperatures in the range of 400–450° C. This temperature region is a problem for most organic polymers, and particularly for many fluorocarbons. Also, adhesion of fluorinated materials (self-adhesion, adhesion to metals, dielectrics, ceramics, etc.) is a problem without some prior surface pretreatment. Further, the stability of fluorinated materials due to interaction with interconnect metallurgy at elevated temperatures is problematic. The mechanical properties of many known fluorinated materials (particularly fluoroalkanes) are not ideal; they usually have large thermal expansion coefficients and are intrinsically soft materials. The latter creates a problem for chemical mechanical polishing (CMP) procedures. Finally, the methodology to develop other highly fluorinated materials such as fluorinated polyimides is limited by synthetic difficulties associated with the incorporation of a substantial number of pendant perfluoroalkyl groups.

Attempts have been made to reduce the dielectric constant of such materials through the introduction of kinks and conjugation-interrupting linkages in the polymer backbone to lower molecular polarizability and reduce chain-chain interactions (St. Clair et al. (1988) *Proc. Amer. Chem. Soc. Div. Polym. Mater. Sci. Eng.* 59:28). A more viable approach, however, has been controlled introduction of porosity into existing low dielectric constant materials.

Generation of porous polymer foams substantially reduces the dielectric constant of the material while maintaining the desired thermal and mechanical properties of the base (or "host") polymer. The reduction in dielectric constant is achieved by incorporating air voids, as air has a dielectric constant of 1.01. The advantage of a foam approach is illustrated in Hedrick et al. (1995) *Polymer* 36:2685, which illustrates in graph form a Maxwell-Garnett model of composite structures based on a matrix polymer having an initial dielectric constant of 2.8. Incorporation of a second phase of dielectric constant 1.01, as with the introduction of air-filled pores in a foam, causes a dramatic reduction in the dielectric constant. However, foams provide a unique set of problems for dielectric applications. The pore size must be much smaller than both the film thickness and any microelectronic device features. In addition, the pores are ideally closed cell, i.e., the connectivity between the pores must be minimal to prevent the diffusion of reactive contaminants. Finally, the volume fraction of the voids must be as high as possible to achieve the lowest possible dielectric constant. All of these features can alter the mechanical properties of the film and affect the structural stability of the foam.

An approach that has been developed for preparing a dielectric polymer foam with pore sizes in the nanometer regime involves the use of block copolymers composed of a high temperature, high $T_g$ polymer and a second component that can undergo clean thermal decomposition with the evolution of gaseous by-products to form a closed-cell, porous structure. See, e.g., Hedrick et al. (1993) *Polymer* 34:4717, and Hedrick et al. (1995) *Polymer* 36:4855. The process involves the use of block copolymers that can undergo thermodynamically controlled phase separation to provide a matrix with a dispersed phase having a roughly spherical equilibrium morphology, monodisperse in size and discontinuous. By using as a host or matrix material a thermally stable polymer of low dielectric constant and, as the dispersed phase, a labile polymer that undergoes thermolysis at a temperature below the $T_g$ of the vitrified matrix to yield volatile reaction products, one can prepare foams with pores in the nanometer dimensional regime that have no percolation pathway; they are closed structures with nanometer size pores that contain air.

While the method has proved to be useful in the laboratory, the inventors herein have found formation of porous structures to be problematic in several respects. That is, although the concept was demonstrated in principle (see Hedrick et al. (1993); and Hedrick et al. (1995)), application was complicated by synthetic difficulties and by the extremely small thermal processing window. Also, the thermal stability of the foam product was limited to about 350–375° C. for thermoplastic hosts (Hedrick et al. (1996) *J. Polym. Sci.; Polym. Chem.* 34, 2867). Furthermore, although dielectric constants of 2.2–2.4 were achieved at porosity levels less than about 20% (see Hedrick et al. (1996)), the pore volume could not be further increased without compromising the small domain sizes and/or the non-interconnectivity of the pore structure.

In U.S. Pat. No. 5,953,627 to Carter et al., also assigned to International Business Machines Corporation (Armonk, N.Y.), low molecular weight amines are described as processing aids and toughening agents to improve the mechanical properties of silsesquioxane films. However, when low molecular weight amines are used as toughening agents or as pore-generating agents (or "porogens"), e.g., in the preparation of organosilicate dielectric materials, formulation stability is lacking and unwanted gelation often occurs within a very short period of time (on the order of hours). U.S. Pat. No. 6,107,357 to Hawker et al., also assigned to International Business Machines Corporation, describes the use of polymeric porogens in the preparation of porous dielectric materials, and while the process is effective, the range of nanoporosities that can be obtained is somewhat limited; that is, the void percentage in the porous product is limited to about 35%.

The present invention provides a novel method for preparing low dielectric materials, particularly dielectric coatings, comprised of films of porous matrices that are essentially free of defects typically associated with densified organosilicates on silicon or glass substrates. The coatings may be prepared with a significantly increased range of obtainable void volumes, wherein the matrices can contain non-interconnected, "closed cell" pores or open celled highly porous channels in the form of sharply defined domains. Typically, the pores and/or porous channels are less than about 500 Å in diameter, preferably less than about 200 Å in diameter, more preferably less than about 100 Å. Ideally, the coatings have very low dielectric constants (on the order of 2.0–2.2, or even lower), are thermally stable at temperatures in excess of about 400° C., preferably greater than about 450° C., and are readily processable by current fabrication techniques, including reactive ion etching (RIE), CMP, and high temperature annealing. The spinning solutions maintain a relatively low viscosity (less than about 10.0 cp) over an extended period (up to 30 days or more). The method involves the use of various nitrogen-containing polymers as pore-generating agents. In view of the problems with formulation stability and gelation encountered by using lower molecular weight, basic nitrogenous molecules in dielectric films, i.e., as in U.S. Pat. No. 5,953,627 to Carter et al., it is indeed surprising that nitrogenous polymers would provide excellent formulation stability and result in substantially defect-free coatings. The nitrogenous porogenic polymers are useful not only in the preparation of defect-free or substantially defect-free coatings, but also as pore-generating agents in the preparation of highly porous, low dielectric constant materials that may or may not be in the form of coatings, and as toughening agents and coating stabilizers.

SUMMARY OF THE INVENTION

Accordingly, it is a primary object of the invention to address the above-mentioned need in the art by providing a method for using nitrogenous polymers as porogens in the preparation of substantially defect-free dielectric coatings comprised of porous polymeric matrices.

It is another object of the invention to provide such a method wherein the coating of the porous polymeric matrix so prepared is comprised of an organosilicate.

It is still another object of the invention to provide a substantially defect-free dielectric coating prepared using the aforementioned process.

It is an additional object of the invention to provide an integrated circuit device in which metallic circuit lines on a substrate are electrically insulated from each other by a dielectric material prepared according to the method of the invention.

Still a further object of the invention is to provide an integrated circuit packaging device (multichip module) that incorporates a dielectric material prepared according to the method of the invention.

Additional objects, advantages and novel features of the invention will be set forth in part in the description which follows, and in part will become apparent to those skilled in the art upon examination of the following, or may be learned by practice of the invention.

The invention thus provides, in one embodiment, a method for making a substantially defect-free dielectric coating comprised of a porous material. Preferably, although not necessarily, the coating material has an average pore size of less than about 500 Å in diameter, preferably less than about 200 Å in diameter, more preferably less than about 100 Å in diameter, a void percentage in the range of approximately 5% to 95%, typically 5% to 85%, and a dielectric constant of less than about 2.5, preferably less than about 2.0. The method involves (a) admixing (i) a decomposable porogen comprised of a nitrogenous polymer containing a plurality of nitrogenous monomer units, the polymer typically although not necessarily having a number average molecular weight $M_n$ of at least about 1000 g/mol, and (ii) a silicon-containing, high temperature thermosetting host polymer, in (iii) a suitable casting solvent, wherein the decomposable porogen and the host polymer are miscible with respect to each other; (b) depositing the admixture so prepared onto a substrate surface to provide an uncured coating thereon; (c) heating the uncured coating to a temperature effective to at least partially, and preferably fully, cure the host polymer and provide a coating of a vitrified, two-phase matrix comprised of vitrified host polymer and the porogen; and (d) decomposing the porogen. The specific method employed to bring about porogen decomposition will depend upon the nature of the porogen, as the porogen may be thermally decomposable, radiation decomposable, or chemically decomposable. For a thermally decomposable porogen, the vitrified, porogen-containing coating is heated to a temperature effective to degrade the porogen without affecting the vitrified host polymer (the curing temperature in step (c) is necessarily lower than the porogen degradation temperature). For a radiation decomposable porogen, the vitrified coating is exposed to radiation effective to degrade the porogen. For a chemically decomposable porogen, the vitrified coating is treated with a chemical reagent suitable to degrade the porogen without otherwise affecting the coating. Optionally, a coupling agent may be introduced into the admixture prepared in step (a), wherein the coupling agent is capable of promoting crosslinking of the porogen, chemical incorporation of the porogen into the host polymer, and possibly crosslinking of the host polymer as well. In addition, a basic catalyst (e.g., an amine or a Bronsted base)

may be used to lower the required curing temperature in step (c), but is also optional and is generally not preferred.

In a further embodiment, a substantially defect-free coating of a dielectric material is provided that is prepared using the aforementioned technique. The defect-free coating is porous in nature, and preferably although not necessarily has an average pore size of less than about 500 Å in diameter, preferably less than about 200 Å in diameter, more preferably less than about 100 Å in diameter, a void percentage in the range of approximately 5% to 95%, preferably 5% to 85%, and a dielectric constant of less than 2.5, preferably less than about 2.0. The coating is comprised of a vitrified host polymer that has a pre-process number average molecular weight $M_n$ in the range of approximately 750 to 100,000 g/mol, and that (after vitrification) is thermally stable at temperatures of at least about 400° C., preferably temperatures of at least about 450° C.

In a further embodiment of the invention, an integrated circuit device is provided that comprises: (a) a substrate; (b) individual metallic circuit lines positioned on the substrate; and (c) a substantially defect-free dielectric coating positioned over and/or between the individual metallic circuit lines, the substantially defect-free coating comprising the novel dielectric coating of the invention.

Still an additional embodiment of the invention relates to an integrated circuit packaging device providing signal and power current to an integrated circuit chip, the packaging device comprising:

(i) a substrate having electrical conductor means for connection to a circuit board, (ii) a plurality of alternating electrically insulating and conducting layers positioned on the substrate wherein at least one of the electrically insulating layers is comprised of a substantially defect-free dielectric coating as provided herein; and (iii) a plurality of vias for electrically interconnecting the electrical conductor, the conducting layers and the integrated circuit chip.

It will be appreciated by those skilled in the art that dielectric coatings may have a host of additional applications, and the invention is not limited in this regard. For example, substrates coated with the dielectric material of the invention can serve as porous separation media and "biochips," i.e., miniaturized supports to be used in the binding and/or assaying of large quantities of biological molecules such as peptides, proteins, oligonucleotides, polynucleotides, and the like.

BRIEF DESCRIPTION OF THE DRAWINGS

FIGS. 2A–2C represent the prior art, wherein FIGS. 2A and 2B are high magnification and low magnification optical photomicrographs, respectively, illustrating defects in a coating of neat MSSQ resin near the edge of a wafer, while FIG. 2C is a high magnification optical photomicrograph illustrating defects in a coating of neat MSSQ resin at the center of a wafer.

DETAILED DESCRIPTION OF THE INVENTION

Definitions and Overview

Figure 1:
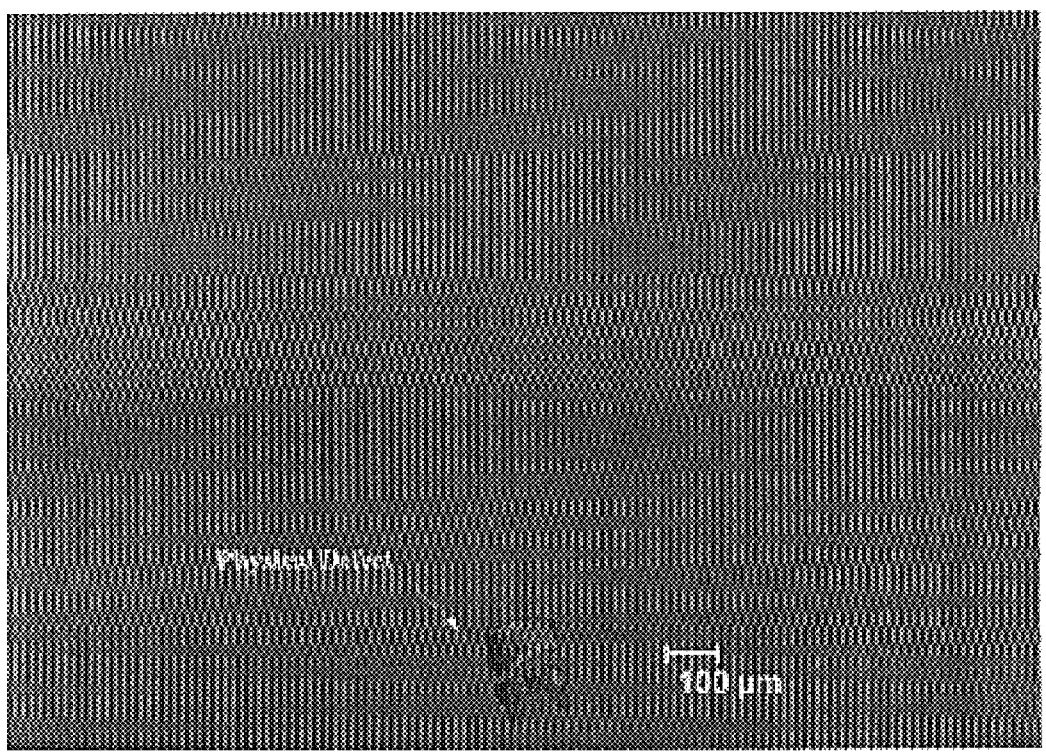
FIG. 1 is a high magnification optical photomicrograph illustrating a substantially defect-free methylsilsesquioxane (MSSQ) coating prepared using the method of the invention.

Before describing the present invention in detail, it is to be understood that unless otherwise indicated this invention is not limited to specific substrates, coating compositions, or process steps, as such may vary. It is also to be understood that the terminology used herein is for the purpose of describing particular embodiments only, and is not intended to be limiting.

It must be noted that, as used in this specification and the appended claims, the singular forms "a," "and," and "the" include plural referents unless the context clearly dictates otherwise. Thus, for example, reference to "a porogen" includes mixtures of porogens, a "host polymer" includes combinations of host polymers, "a solvent" includes mixtures of solvents, and the like.

In describing and claiming the present invention, the following terminology will be used in accordance with the definitions set out below.

The term "alkyl" as used herein refers to a branched or unbranched saturated hydrocarbon group of 1 to approximately 24 carbon atoms, such as methyl, ethyl, n-propyl, isopropyl, n-butyl, isobutyl, t-butyl, octyl, decyl, tetradecyl, hexadecyl, eicosyl and tetracosyl, as well as cycloalkyl groups such as cyclopentyl and cyclohexyl. The term "lower alkyl" intends an alkyl group of 1 to 6 carbon atoms, and thus includes methyl, ethyl, n-propyl, isopropyl, n-butyl, isobutyl, t-butyl, n-pentyl, cyclopentyl, n-hexyl, cyclohexyl, etc.

The term "alkylene" as used herein refers to a difunctional saturated branched or unbranched hydrocarbon chain containing from 1 to approximately 24 carbon atoms, typically 1 to approximately 12 carbon atoms, and includes, for example, methylene (—CH$_2$—), ethylene (—CH$_2$—CH$_2$—), propylene (—CH$_2$—CH$_2$—CH$_2$—), 2-methylpropylene (—CH$_2$—CH(CH$_3$)—CH$_2$—), hexylene (—(CH$_2$)$_6$—), and the like. "Lower alkylene," as in the lower alkylene linkage of the optional coupling agent herein, refers to an alkylene group of 1 to 6, more preferably 1 to 4, carbon atoms.

The term "alkoxy" as used herein refers to a substituent —O—R wherein R is alkyl as defined above. The term "lower alkoxy" refers to such a group wherein R is lower alkyl as defined above, e.g., methoxy, ethoxy and the like.

The term "aryl" as used herein, and unless otherwise specified, refers to an aromatic moiety containing 1 to 5 aromatic rings. For aryl groups containing more than one aromatic ring, the rings may be fused or linked. Aryl groups are optionally substituted with one or more inert, nonhydrogen substituents per ring; suitable "inert, nonhydrogen" substituents include, for example, halo, haloalkyl (preferably halo-substituted lower alkyl), alkyl (preferably lower alkyl), alkenyl (preferably lower alkenyl), alkynyl (preferably lower alkynyl), alkoxy (preferably lower alkoxy), alkoxycarbonyl (preferably lower alkoxycarbonyl), carboxy, nitro, cyano and sulfonyl. Unless otherwise indicated, the term "aryl" is also intended to include heteroaromatic moieties, i.e., aromatic heterocycles. Generally, although not necessarily, the heteroatoms will be nitrogen, oxygen or sulfur.

The term "halo" is used in its conventional sense to refer to a chloro, bromo, fluoro or iodo substituent. In the reagents and materials described and claimed herein, halo substituents are generally fluoro or chloro. The terms "haloalkyl," "haloaryl" (or "halogenated alkyl" or "halogenated aryl") refer to an alkyl or aryl group, respectively, in which at least one of the hydrogen atoms in the group has been replaced with a halogen atom.

The term "hydrocarbyl" is used in its conventional sense to refer to a hydrocarbon group containing carbon and hydrogen, and may be aliphatic, alicyclic or aromatic, or may contain a combination of aliphatic, alicyclic and/or aromatic moieties. The hydrocarbyl substituents herein generally contain 1 to 24 carbon atoms, more typically 1 to 12 carbon atoms, and may be substituted with various substituents and functional groups.

The term "polymer" is used to refer to a chemical compound that comprises linked monomers, and that may or may not be linear, crosslinked or thermosetting.

The term "miscible" refers to two (or more) polymers that when mixed and processed into a film give rise to a composition having a single glass transition temperature $T_g$, and further that this is the case over a broad compositional range, i.e., in a composition comprised of anywhere from about 5 to 95 wt. % of a first polymer and, correspondingly, from about 95 to 5 wt. % of a second polymer. The polymeric nitrogenous porogen and the host polymer used to prepare the defect-free coatings of the invention are "miscible" with respect to each other over the aforementioned compositional ranges.

The term "substantially defect-free" refers to a coating on a substrate that has fewer than ten defects in an 8" wafer (i.e., a circular wafer with an 8" diameter). Such coatings are also referred to herein as "defect-free," but it is to be understood that the coatings are not necessarily 100% free of defects.

In a first embodiment, the invention provides a process for preparing a substantially defect-free coating comprised of a porous polymeric matrix. If desired, the process can enable preparation of a thermally and chemically stable porous material with a high void percentage, typically on the order of 5% to 95%, preferably on the order of 15% to 95%, with pores less than about 500 Å in diameter, preferably less than about 200 Å in diameter, more preferably less than about 100 Å in diameter, and a dielectric constant less than about 2.5, optimally less than about 2.0.

The process involves, at the outset, admixing, in a suitable casting solvent, (i) a thermally decomposable, radiation decomposable or chemically decomposable porogen comprised of a nitrogenous polymer containing a plurality of nitrogenous monomer units, the polymer typically although not necessarily having a number average molecular weight $M_n$ of at least about 1000 g/mol, (ii) a silicon-containing, high temperature thermosetting host polymer, or a precursor to such a polymer, wherein the porogen and the host polymer are miscible with respect to each other, and optionally (iii) a coupling or "crosslinking" agent effective to crosslink the porogen, promote incorporation of the porogen into the host polymer, and possibly crosslink the host polymer as well. Admixture is generally although not necessarily carried out by first dissolving the host polymer or a precursor thereto in the solvent, followed by addition of the porogen. Admixture will typically be carried out at room temperature. Then, the admixture is deposited as a coating on a substrate surface, e.g., the surface of a silicon wafer. In the next step of the process, the admixture, i.e., the uncured film prepared from the mixture of the host polymer and porogen, is heated to a temperature effective to partially or fully cure the host polymer and provide a vitrified, two-phase polymeric matrix in which all or substantially all of the porogen is present as a discrete phase within a continuous phase formed by the host polymer. This initial heating step is carried out at a temperature below the decomposition temperature of the porogen, typically at a temperature in the range of approximately 150° C. to about 250° C., preferably 200° C. to about 250° C. Next, if the porogen is thermally decomposable, the porogen is thermally degraded by heating to a higher temperature, i.e., a temperature that is higher than the thermal decomposition temperature of the porogen, but not so high that chemical modification, physical modification, or decomposition of the vitrified host polymer would result. If the porogen is radiation decomposable, the vitrified matrix is exposed to radiation effective to decompose the porogen; the radiation may be ultraviolet, x-ray, electron beam, or the like. Analogously, if the porogen is chemically decomposable, the vitrified matrix may be treated with a chemical reagent effective to chemically degrade the porogen. Thermal, radiation-induced, and chemical decomposition cause the porogen to decompose to volatile fragments that diffuse out of the rigid matrix of the host polymer, leaving closed cell pores or open channels (depending on void volume) present throughout. The pore size in this resulting porous matrix will generally be similar in size relative to the domains of the porogen in the vitrified two-phase matrix.

The Host Polymer

As noted above, the present process involves the use of a high temperature thermosetting host polymer. Generally, the host polymer is a silicon-containing polymer, or a precursor to such a polymer, preferably organic polysilica, and has a number average molecular weight $M_n$ typically in the range of about 750 to about 100,000 g/mol. For simplicity, the term "host polymer" is used herein to refer to the polymer per se as well as to precursors to the host polymer (e.g., uncondensed alkoxysilanes or organically modified silicates, which are actually precursors to polysilica).

Organic polysilica is a polymeric compound comprising silicon, carbon, oxygen and hydrogen atoms. Suitable organic polysilica include (i) silsesquioxanes, (ii) alkoxy silanes, preferably partially condensed alkoxysilanes (e.g., partially condensed by controlled hydrolysis of tetraethoxysilane having an $M_n$ of about 500 to 20,000), (iii) organically modified silicates having the composition $RSiO_3$ and $R_2SiO_2$ wherein R is an organic substituent, and (iv) orthosilicates, preferably partially condensed orthosilicates having the composition $Si(OR)_4$. As is known in the art, silsesquioxanes are polymeric silicate materials of the type $(RSiO_{1.5})_n$ where R is an organic substituent. Combinations of two or more different organic silicas may also be used.

Suitable organic polysilica for use in the present invention will be known to those skilled in the art, and/or are described in the pertinent texts, patents and literature. See, for example, U.S. Pat. No. 5,384,376 to Tunney et al., U.S. Pat. No. 6,107,357 to Hawker et al., and U.S. Pat. No. 6,143,643 to Carter et al., and Chem. Rev. 95:1409–1430 (1995). Preferably, the organic polysilica is a silsesquioxane. Suitable silsesquioxanes for the present invention include, but are not limited to, hydrogen silsesquioxanes, alkyl (preferably lower alkyl, e.g., methyl) silsesquioxanes, aryl (e.g., phenyl) or alkyl/aryl silsesquioxanes, and copolymers of silsesquioxanes (e.g., copolymers of polyimides and silsesquioxanes). The silsesquioxanes are commercially available, e.g., as glass resins of the GR series (GR100, GR150, GR650, GR950, etc.) from Techniglass, Perrysburg, Ohio.

The Porogen

The porogen is a thermally degradable, photochemically degradable, or chemically decomposable nitrogenous polymer comprised of a plurality of nitrogenous monomer units, which upon exposure to radiation, heat or an appropriate chemical reagent, decomposes quantitatively into non-reactive species that can readily diffuse through the host polymer matrix. With a thermally degradable porogen, the temperature at which decomposition occurs should be sufficiently high to permit standard film preparation yet be below the temperature at which the host polymer would be chemically modified, physically modified, or degraded. Thermally degradable porogens used herein will generally although not necessarily have a decomposition temperature less than about 45° C., typically in the range of about 300° C. to about 400° C., and preferably in the range of about 350° C. to about 400° C. For radiation-decomposable porogens, the vitrified coating is exposed to radiation effective to decompose the porogen; the radiation may be ultraviolet, x-ray, electron beam, or the like. Analogously, if the porogen is chemically decomposable, the vitrified matrix may be treated with a chemical reagent effective to chemically degrade the porogen. For example, acids and bases may be used to degrade acid-decomposable and base-decomposable porogens, respectively.

A wide range of nitrogenous polymers may be used, providing that the polymer has a suitable decomposition temperature. Suitable nitrogenous polymers include linear, branched and crosslinked polymers, including crosslinked polymeric nanoparticles (typically 2 to 100 nm in diameter, preferably 5 to 20 nm in diameter). "Branched" polymers include hyperbranched polymers (containing two or more generations of branching) and dendrimeric polymers. In contrast to hyperbranched polymers, dendrimers are regularly branched macromolecules with a branch point at each repeat unit. Also, hyperbranched polymers are obtained via a polymerization reaction, while most regular dendrimers are obtained by a series of stepwise coupling and activation steps. Examples of dendrimers include the polyamidoamine (PAMAM) Starburst™ dendrimers of Tomalia et al. (1985) *Polym. J.* 17:117 and the convergent dendrimers of Hawker et al. (1990) *J. Am. Chem. Soc.* 112:7638. The nitrogen-containing functionalities of the polymeric porogen may be, for example, any one or a combination of the following:

primary amino (—$NH_2$) groups;

mono-substituted (secondary) amino groups —NHR where R is hydrocarbyl, generally either alkyl or aryl, e.g., lower alkyl or phenyl, and may be substituted with one or more nonhydrocarbyl substituents, e.g., 1 to 3 halo, hydroxyl, thiol, or lower alkoxy groups (such —NHR groups include, for example, methylamino, ethylamino, isopropylamino, butylamino, cyclopropylamino, cyclohexylamino, n-hexylamino, phenylamino, benzylamino, chloroethylamino, hydroxyethylamino, etc.);

di-substituted (tertiary) amino groups —$NR^1R^2$ where $R^1$ and $R^2$ may be the same or different and are as defined above for R (suitable —$NR^1R^2$ include, for example, dimethylamino, diethylamino, diisopropylamino, dibutylamino, methylpropylamino, methylhexylamino, methylcyclohexylamino, ethylcyclopropylamino, ethylchloroethylamino, methylbenzylamino, methylphenylamino, methyltoluylamino, methyl-p-chlorophenylamino, methylcyclohexylamino, etc.);

amides —(CO)—$NR^3R^4$ where $R^3$ and $R^4$ may be the same or different and are either hydrogen or R, wherein R is as defined above (including, for example, amides wherein one of $R^3$ and $R^4$ is H and the other is methyl, butyl, benzyl, etc.);

cyano (—C≡—N);

aromatic nitrogen-containing heterocycles, typically five- or six-membered monocyclic substituents, or bicyclic fused or linked five- or six-membered rings (such as pyrrolyl, pyrrolidinyl, pyridinyl, quinolinyl, indolyl, pyrimidinyl, imidazolyl, 1,2,4-triazolyl, tetrazolyl, etc.);

non-aromatic nitrogen-containing heterocycles, typically four- to six-membered rings, including lactams and imides, e.g., pyrrolidino, morpholino, piperazino, piperidino, N-phenyl-β-propiolactam, γ-butyrolactam, ε-caprolactam, acetimide, phthalimide, succinimide, etc.; and nitrogenous backbone functionalities such as —$NR^5$— where $R^5$ is hydrogen or as defined for R, wherein R is defined above, and imine linkages —N═.

For example, typical nitrogenous porogens for use herein may be polymerized from one or more of the following monomers: acrylamide; methacrylamide; acrylonitrile; methacrylonitrile; acrylates and methacrylates substituted with a primary, secondary or tertiary amino group optionally bound through a lower alkylene linker (e.g., dimethylaminoethyl methacrylate); 2-, 3- or 4-vinyl pyridines, typically 2- and 4-vinyl pyridine; vinyl 2-pyrrolidinone; N,N-dialkylaminoalkyl methacrylates, typically where the alkyl substituents are lower alkyl (e.g., N,N-dimethylaminoethyl methacrylate); o-, m-, and p-aminostyrene; and N-substituted o-, m-, and p-aminostyrene (e.g., substituted with an a lower alkyl or lower alkylamino group). The foregoing list is intended to be illustrative and not limiting with regard to possible nitrogen-containing monomers that can be used in the preparation of suitable polymeric porogens herein.

Exemplary nitrogenous polymers suitable for use as the porogen in the present process include, but are not limited to: poly(acrylamide); poly(methacrylamide); N,N-dialkyl poly(acrylamide) (particularly wherein the nitrogen-bearing substituents are $C_1$–$C_{12}$ alkyl); N,N-dialkyl poly(methacrylamide) (again, particularly wherein the nitrogen-bearing substituents are $C_1$–$C_{12}$ alkyl); poly(alkoxylated polyamide) (e.g., N-methoxymethylated polyamide and hydroxyethylated polyamide); poly(ε-caprolactam); polypropiolactam; polycapryllactam; polylauryllactam; poly(pyrrolidin-2-one); poly(vinylamine); poly(vinyl pyrrolidone); poly(2-vinylpyridine); poly(3-vinylpyridine); poly(4-vinylpyridine); poly(o-aminostyrene); poly(m-aminostyrene); poly(p-aminostyrene); polyethyleneimine; N-alkylated polyethyleneimine (particularly polyethylene imine alkylated with a $C_1$–$C_{12}$ alkyl substituent); N-acylated polyethylene imine (again, where the nitrogen-bearing substituents are $C_1$–$C_{12}$); poly(p-phenylene terephthalamide); polyetherimides; polyimides; polyurethanes; polyhydrazides; polybenzimidazole; poly(1,2,4-triazole); polyhydantoin; polyimidines; and copolymers thereof or with other polymeric species (e.g., poly(styrene-co-acrylonitrile) and poly(butadiene-co-acrylonitrile)).

Copolymers of non-nitrogenous monomers and nitrogenous monomers can also be advantageously employed. Suitable non-nitrogenous comonomers include, but are not limited to, the following ethylenically unsaturated polymerizable monomers: acrylic and methacrylic acid esters and amides, including alkyl acrylates, aryl acrylates, alkyl methacrylates and aryl methacrylates (for example, methyl acrylate, methyl methacrylate, n-butyl acrylate, n-butyl methacrylate, t-butyl acrylate, t-butyl methacrylate, 2-ethylhexyl methacrylate, benzyl acrylate and N-phenylacrylamide). The ratio of non-nitrogenous monomer units to nitrogenous monomer units will generally be in the ratio of about 1:99 to 99:1, preferably about 1:10 to 10:1, more preferably about 1:5 to 5:1, and most preferably about 1:1 to 5:1.

For example, copolymers of acrylate monomers such as methyl methacrylate and a comonomer having pendant amino groups have been found to be optimal. One such copolymer is poly(methyl methacrylate-co-dimethylaminoethyl methacrylate) (poly(MMA-DMAEM), wherein the ratio of MMA to DMAEM is in the range of about 1:1 to 5:1, optimally about 3:1; see Example 1.

Also suitable are polymers that can be obtained commercially in the form of nanoparticles, i.e., particles having an average diameter in the range of about 5 nm to 100 nm. Such particulate nitrogenous polymers are available, for example, from Rohm & Haas.

The number average molecular weight $M_n$ of the nitrogenous polymer is generally at least about 1000 g/mol, preferably at least about 6000 g/mol, and can be as high as 80,000 g/mol or more. Optimally, the $M_n$ is in the range of about 6000 to 15,000 g/mol.

Coupling Agents

As noted previously, a coupling agent may be used to crosslink the porogen, promote incorporation of the porogen into the host polymer, and possibly crosslink the host polymer as well. The coupling agent is optional, and will generally be used only when a higher degree of crosslinking is desired or necessary than is obtainable without a coupling agent, or when the porogen is to be covalently coupled to the host polymer. Suitable coupling agents have one or more functional groups at each terminus, each functional group capable of covalently binding to the porogen, and optionally to the host polymer as well. Thus, the molecular structure of the coupling agent may be represented as $R^6$—L—$R^7$ wherein $R^6$ and $R^7$ are functional groups that enable covalent binding to reactive sites on another molecular moiety, e.g., the porogen, and L is a hydrocarbylene linker containing at least two carbon atoms.

The coupling agent may bind to the porogen and optionally the host polymer via any chemical mechanism that results in covalent attachment. For coupling to porogens that contain hydroxyl or free amino groups as nucleophilic sites, $R_6$ and/or $R^7$ are functional groups that enable covalent binding to such nucleophilic moieties. Examples of such functional groups include, but are not limited to, isocyanates, ketenes, cyano, imino ethers, carbodiimides, aldehydes, ketones, or the like.

For binding to the host polymer, $R^6$ and/or $R^7$ are typically selected to enable covalent attachment to Si—OH groups of the organic polysilica. Preferred $R^6$ and/or $R^7$ moieties in this case have the structural formula —$SiX_3$ wherein the X substituents may be the same or different, and are either leaving groups or inert hydrocarbyl moieties, with the proviso that at least one of the X substituents must be a leaving group. Typically, the leaving groups are hydrolyzable so as to form a siloxane (—Si—O—) linkage with a hydroxyl group present on the host polymer. Examples of suitable leaving groups include, but are not limited to, halogen atoms, particularly chloro, and alkoxy moieties, particularly lower alkoxy moieties. When all three X substituents are leaving groups, —$SiX_3$ will then be, for example, trichlorosilyl, trimethoxysilyl, triethoxysilyl, or the like. If an inert hydrocarbyl substituent is present, it is generally a lower alkyl group, e.g., methyl, ethyl, isopropyl, n-propyl, t-butyl, etc. Thus, —$SiX_3$ may also be diisopropylchlorosilyl, dimethylchlorosilyl, ethyldichlorosilyl, methylethylchlorosilyl, or the like. Other $R^6$ and/or $R^7$ moieties will be appropriate for other host polymers, as will be appreciated by those skilled in the art.

The linker L between $R^6$ and $R^7$ is hydrocarbylene, typically $C_2$–$C_{24}$ hydrocarbylene, including, but not limited to, alkylene, arylene, and alkyl ether linkages, optionally substituted with one or more, typically one or two, lower alkyl, halogen, aryl, or other substituents. Particularly preferred L moieties are unsubstituted $C_2$–$C_{12}$ alkylene linkages, with $C_2$–$C_6$ alkylene linkages most preferred, and n-propylene and n-butylene being particularly optimal.

If a coupling agent is used, the coupling agent and porogen are optimally present in an approximately 1:1 ratio, and temperatures in the range of about 25° C. to about 150° C. are usually sufficient to effect crosslinking.

Matrix Preparation/Vitrification and Decomposition of the Porogen

Preparation of the porous dielectric material using the method invention involves, as noted earlier herein, preparation and vitrification of a coating that is comprised of a two-phase polymeric matrix, i.e., a matrix composed of the host polymer and the porogen, followed by decomposition of the porogen using heat, radiation, or a chemical reagent effective to degrade the porogen.

The coating composed of the two-phase polymeric matrix is prepared and cured as follows. The selected porogen and the host polymer, which, again, are miscible with respect to each other, are admixed at approximately room temperature in a suitable high boiling point solvent, e.g., N-methylpyrrolidone, dimethylacetamide, dimethylphenyl urea, butyl acetate, 2-ethoxyethanol, cyclohexanone, γ-butyrolactone, ethyl lactate, ethoxyethylpropionate (EEP), alkylene glycol alkyl ether esters such as propylene glycol methyl ether acetate (PGMEA), and alkylene glycol alkyl ethers such as propylene glycol methyl ether (PGME) and propylene glycol n-propyl ether (PGn-PE). A catalyst, generally a basic catalyst such as an amine or a Bronsted base (e.g., N-methyldiethanolamine) may be added in order to lower the curing temperature in the next step of the process. Generally, however, a basic catalyst is not used since silsesquioxane polymers tend to be unstable in the presence of low molecular weight bases (thus, if a basic catalyst is employed, the next step of process must be carried out immediately), The solids content of the solution is generally about 10 wt. % to 60 wt. %, preferably about 30 wt. % to 40 wt. %, with the relative quantities of porogen and host polymer selected to result in a vitrified matrix in which the porogen represents approximately 5 vol. % to 95 vol. % thereof, preferably 15 vol. % to 95 vol. %, more preferably approximately 40 vol. % to 95 vol. %. For very high porosity coatings, higher porogen content is necessary, e.g., 65 vol. % to 95 vol. %, optimally 70 vol. % to 95 vol. %. This solution may be used to prepare the dielectric coating immediately after preparation, or it may be stored, as in the absence of a low molecular weight base, the solution is surprisingly stable for the extended periods of time typically required in the industry.

The dielectric material prepared from the solution is a coating, although the material can be used in other contexts as well; see copending, commonly assigned U.S. patent application Ser. No. 09/808,726, for "Nitrogen-Containing Polymers as Porogens in the Preparation of Highly Porous, Low Dielectric Constant Materials" (also to Hawker et al.), filed on even date herewith. In preparing a dielectric coating, the aforementioned solution is used to coat the surface of a substrate such as may be made of, for example, silicon, silicon dioxide, silicon-germanium, glass, silicon nitride and other ceramics, aluminum, copper and gallium arsenide. Other suitable substrates will be known to those of ordinary skill in the art. In a multilayer integrated circuit device, an underlying layer of insulated, planarized circuit lines can also function as a substrate.

In the next step of the process, the admixture, i.e., the uncured coating of the host polymer and porogen, is heated to a temperature effective to partially or fully cure the host polymer (e.g., by condensing organic polysilica) and provide a coating comprised of a vitrified, two-phase polymeric matrix in which the porogen is present as a discrete or substantially discrete phase within a continuous phase formed by the host polymer. This initial heating step is carried out at a temperature below the decomposition temperature of the porogen, typically at a temperature in the range of approximately 150° C. to about 250° C., preferably 200° C. to about 250° C. Heating may be carried out directly or in a step-wise fashion (e.g., 200° C. for 2 hrs and then ramped up at 5° C./min to 250° C. and held for 2 hrs). Surface properties of the cured coating may be altered depending on curing atmosphere. For example, curing under nitrogen will yield a hydrophobic coating, while curing in an oxygen-containing atmosphere such as air will give rise to a hydrophilic coating (as will curing using an electron beam).

The final step of the process involves decomposing the porogen dispersed within the cured coating. Photochemically labile porogens can be decomposed by exposure of the coating to radiation effective to bring about decomposition, e.g., ultraviolet, x-ray, electron beam, or the like. If the porogen is thermally decomposable, degradation may be accomplished by heating the cured coating to a temperature at or above the thermal decomposition temperature of the polymer, but below a temperature that would result in chemical modification, physical modification, or decomposition of the vitrified host polymer. If the porogen is chemically decomposable, the cured coating may be treated with a chemical reagent effective to degrade the porogen. Thermal, chemical or radiation-induced decomposition causes the porogen to decompose into fragments that diffuse out of the rigid matrix of the host polymer, leaving pores present throughout. The pore size in this resulting porous matrix will generally be similar in size relative to the domains of the porogen in the vitrified two-phase matrix. Pore size may be altered, if desired, by varying the molecular weight, degree of functionalization, and/or relative concentration of the porogen. That is, actual pore diameters depend on many parameters, including porogen molecular weight, resin structure, and loading level. In general, pore diameters increase with porogen loading level and porogen molecular weight. In addition, for a given porogen, molecular weight and loading level, the porous morphology may vary to some extent with respect to the chemical structure of the resin (for example, the pore sizes obtained for Techniglass GR-650 and Hitachi HSQ RZ25 methyl silsesquioxanes are comparable, but are at least a factor of two larger when Dow Corning DC-15K methyl silsesquioxane is used).

The Substantially Defect-free Dielectric Coating

The coating prepared using the methodology described in the preceding section is a substantially defect-free dielectric coating comprised of a porous polymeric material with a number of advantageous properties. That is, the coating:

is substantially defect-free in that fewer than 10 defects are present in an 8" wafer;

tends to have a low thermal expansion coefficient at elevated temperatures, which assists in avoiding film cracking during thermal processing;

has enhanced mechanical toughness;

has mechanical properties that enable it to be chemically/mechanically planarized to facilitate lithographic formation of multiple circuit levels in multilevel integrated circuit devices;

is optically clear and adheres well to substrates;

depending on the amount and molecular weight of the porogen used, can be prepared so as to have very high porosity, with a void percentage up to about 95%, and pores less than about 50 nm (i.e., less than about 500 Å), preferably less than about 20 nm (i.e., less than about 200 Å), most preferably less than about 10 nm (i.e., less than about 100 Å) in diameter—such coatings will have an exceptionally low dielectric constant, less than about 2.5, preferably less than less than about 2.0, at 25° C.; and is useful not only in integrated circuit technology but also in metallurgy and other fields.

The invention thus addresses a widespread need in the art for dielectric coatings on silicon-containing, glass or other substrates, wherein the dielectric coatings are not only defect-free but possess a number of other advantages as well.

Integrated Circuit Devices

Figure 4:
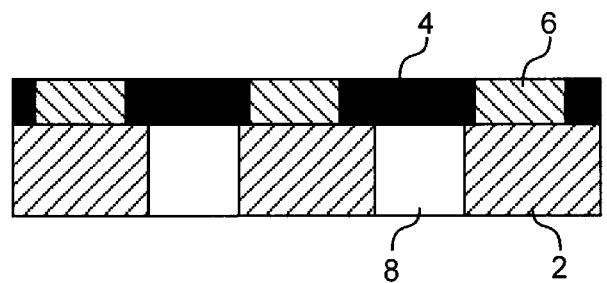
FIG. 4 is a cross-sectional view of a portion of an integrated circuit device fabricated using the novel dielectric materials provided herein.

A primary use of the novel dielectric coatings is in the manufacture of electronic devices, particularly integrated circuit devices. An integrated circuit device according to the present invention is exemplified in FIG. 4, wherein the device is shown as comprising substrate 2, metallic circuit lines 4, and a dielectric material 6 of the present invention. The substrate 2 has vertical metallic studs 8 formed therein. The circuit lines function to distribute electrical signals in the device and to provide power input to and signal output from the device. Suitable integrated circuit devices generally comprise multiple layers of circuit lines that are interconnected by vertical metallic studs.

Suitable substrates 2 comprise silicon, silicon dioxide, silicon-germanium, glass, silicon nitride and other ceramics, aluminum, copper, or gallium arsenide. Suitable circuit lines generally comprise a metallic, electrically conductive material such as copper, aluminum, tungsten, gold or silver, or alloys thereof Optionally, the circuit lines may be coated with a metallic liner such as a layer of nickel, tantalum or chromium, or with other layers such as barrier or adhesion layers (e.g., SiN, TiN, or the like).

Figure 5:
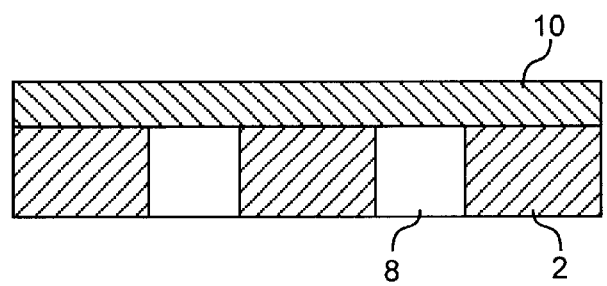
FIGS. 5–8 schematically illustrate a process for making an integrated circuit device using the present dielectric materials.

The invention also relates to processes for manufacturing integrated circuit devices containing a dielectric composition as described and claimed herein. Referring to FIG. 5, the first step of one process embodiment involves disposing on a substrate 2 a layer 10 of an admixture of the polymeric nitrogenous polymer and the host polymer or a precursor thereto in a suitable solvent. The admixture is applied to the substrate by art known methods such as spin or spray coating, dipping or doctor blading. The film is heated to a temperature effective to bring about curing and thus provide a vitrified polymeric matrix, followed by further heating of the composition (to a higher temperature) or irradiation, in order to decompose the porogen and convert layer 10 to a dielectric material of the invention.

Figure 6:
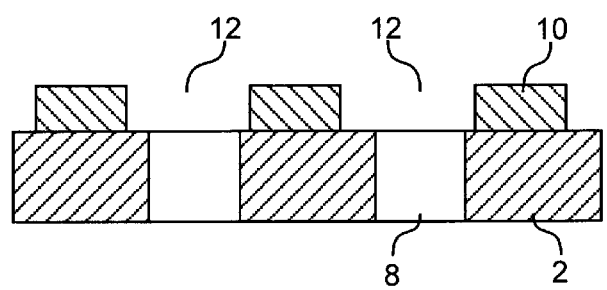

Referring to FIG. 6, the third step of the process involves lithographically patterning the layer 10 of dielectric composition to form trenches 12 (depressions) therein. The trenches 12 shown in FIG. 6 extend to the substrate 2 and to the metallic studs 8. Lithographic patterning generally involves: (i) coating the layer 10 of the dielectric material with a positive or negative photoresist such as those marketed by Shipley or Hoechst Celanese, (AZ photoresist); (ii) imagewise exposing (through a mask) the photoresist to radiation such as electromagnetic, e.g., UV, deep UV, vacuum UV, electron beam, etc.; (iii) developing the image in the resist, e.g., with suitable basic developer; and (iv) transferring the image through the layer 10 of dielectric composition to the substrate 2 with a suitable transfer technique such as reactive ion blanket or beam etching (RIE). Suitable lithographic patterning techniques are well known to those skilled in the art such as disclosed in *Introduction to Microlithography*, 2nd Ed., eds. Thompson et al. (Washington, D.C.: American Chemical Society, 1994).

Figure 7:
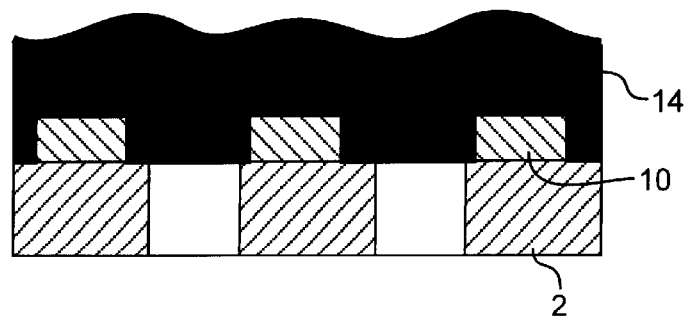

Referring to FIG. 7, in the fourth step of the process for forming an integrated circuit of the present invention, a metallic film 14 is deposited onto the patterned dielectric layer 10. Preferred metallic materials include copper, tungsten, and aluminum. The metal is suitably deposited onto the patterned dielectric layer by art-known techniques such as chemical vapor deposition (CVD), plasma-enhanced CVD, electro and electroless deposition (seed-catalyzed in situ reduction), sputtering, or the like.

Figure 8:
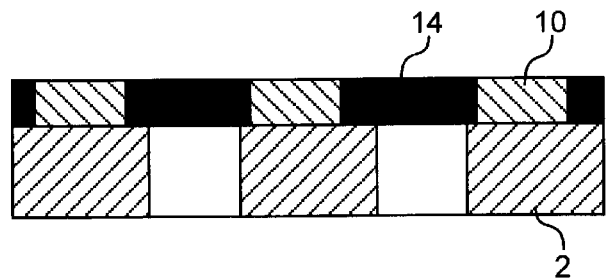

Referring to FIG. 8, the last step of the process involves removal of excess metallic material by "planarizing" the metallic film 14 so that the film is generally level with the patterned dielectric layer 10. Planarization can be accomplished using chemical/mechanical polishing or selective wet or dry etching. Suitable methods for chemical/mechanical polishing are known to those skilled in the art.

Figure 9:
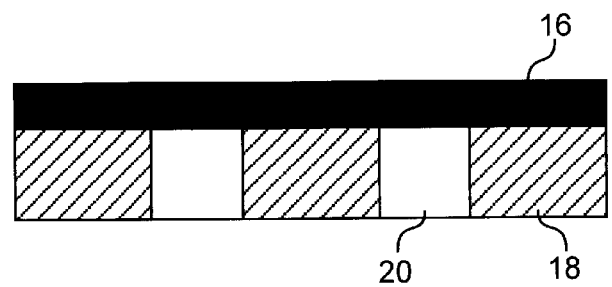
FIGS. 9–11 schematically illustrate an alternative process for making an integrated circuit device using the present dielectric materials.
Figure 10:
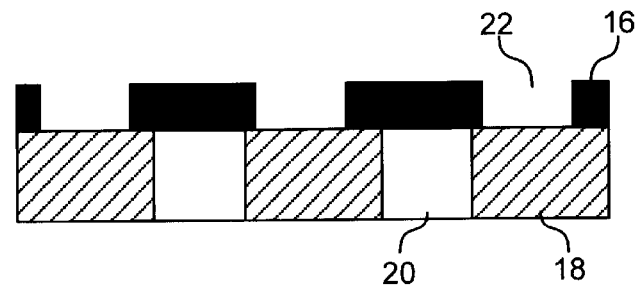
Figure 11:
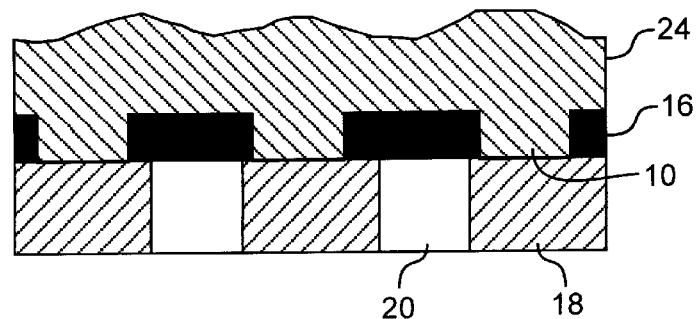

Referring to FIGS. 9–11, there is shown an alternative process for making an integrated circuit device of the invention. The first step of the process in this embodiment involves depositing a metallic film 16 onto a substrate 18. Substrate 18 is also provided with vertical metallic studs 20. Referring to FIG. 10, in the second step of the process, the metallic film is lithographically patterned through a mask to form trenches 22. Referring to FIG. 11, in the third step of the process, a layer 24 of a reaction mixture comprising the porogen, the host polymer, the coupling agent, and the selected solvent is deposited onto the patterned metallic film 16. In the last step of the process, the mixture is heated to crosslink the host polymer, followed by heating to a higher temperature effective to decompose the porogen. Optionally, the dielectric layer so provided may then be planarized, if necessary, for subsequent processing in a multilayer integrated circuit.

The invention additionally relates to an integrated circuit packaging device (multichip module) for providing signal and power current to one or more integrated circuit chips comprising: (i) a substrate having electrical conductor means for connection to a circuit board; (ii) a plurality of alternating electrically insulating and conducting layers positioned on the substrate wherein at least of the layers comprises a film of a dielectric material of the present invention; and (iii) a plurality of vias for electrically interconnecting the electrical conductor means, conducting layers and integrated circuit chips.

The integrated circuit packaging device represents an intermediate level of packaging between the integrated circuit chip and the circuit board. The integrated circuit chips are mounted on the integrated circuit packaging device which is in turn mounted on the circuit board.

The substrate of the packaging device is generally an inert substrate such as glass, silicon or ceramic; suitable inert substrates also include epoxy composites, polyimides, phenolic polymers, high temperature polymers, and the like. The substrate can optionally have integrated circuits disposed therein. The substrate is provided with electrical conductor means such as input/output pins (I/O pins) for electrically connecting the packaging device to the circuit board. A plurality of electrically insulating and electrically conducting layers (layers having conductive circuits disposed in an dielectric insulating material) are alternatively stacked up on the substrate. The layers are generally formed on the substrate in a layer-by-layer process wherein each layer is formed in a separate process step.

The packaging device also comprises receiving means for receiving the integrated circuit chips. Suitable receiving means include pinboards for receipt of chip I/O pins or metal pads for solder connection to the chip. Generally, the packaging device also comprises a plurality of electrical vias generally vertically aligned to electrically interconnect the I/O pins, the conductive layers and integrated circuit chips disposed in the receiving means. The function, structure and method of manufacture of such integrated circuit packaging devices are well known to those skilled in the art, as disclosed, for example in U.S. Pat. Nos. 4,489,364, 4,508,981, 4,628,411 and 4,811,082.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

Experimental

The following examples are put forth so as to provide those of ordinary skill in the art with a complete disclosure and description of how to prepare and use the oligomers and polymers disclosed and claimed herein. Efforts have been made to ensure accuracy with respect to numbers (e.g., quantities, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures.

EXAMPLE 1

Comparison of Neat Resin Coatings with Coatings Prepared Using Polymeric Nitrogenous Porogens:

(a) Preparation of neat resin coatings: Twenty gm of solid glass resin was dissolved in 80 gm of propylene glycol methyl ether (PGME), propylene glycol methyl ether acetate (PGMEA), or propylene glycol n-propyl ether (PGn-PE) with vigorous shaking for 30 minutes. The clear solution was then filtered down to 0.2 microns employing Teflon membrane filters or propylene filter cartridges. The filtered solution was then spin coated onto clean Si wafers using the following procedure: Approximately 0.5 mL of resin solution was deposited in the center of a 2 inch wafer and the substrate spun at 1000 rpm for 5 seconds to evenly spread the solution across the wafer surface. The speed was then increased to 3000 rpm for 30 seconds followed by a backside rinse of the substrate at 1000 rpm for 3 seconds and a final drying step at 3000 rpm for 10 seconds. The sample was then placed on a hot plate maintained at 100° C. for 5 minutes. Upon ramping up the temperature at 3–5° C./minute, "volcano" defects generally appeared at approximately 150° C. Alternatively, the soft baked sample is then heated in a controlled atmosphere oven at 450° C. for 2 hours using a ramp-up of 3° C./minute. Upon cooling, identical volcano defects were observed.

(b) Coatings prepared with methyl silsesquioxane (MSSQ) and a polymeric nitrogenous porogen: A formulation with an intended porosity of approximately 20 percent was prepared by mixing 8.0 gm of a 20 wt % glass resin solution with 2.0 gm of a 20 wt % poly(methylmethacrylate-co-N,N-dimethylaminoethyl methacrylate)(poly(MMA-DMAEM), 3:1 MMA:DMAEM) solution. The preferred solvents for both the organosilicate resin and the pore generating polymer are PGME and PGn-PE. The resulting mixture was filtered down to 0.2 microns, and a spin coating procedure was used identical to that described in part (a). The coated substrate was then placed on a hot plate maintained at 100° C. for 5 minutes. Following the soft bake step, the substrate was then heated in a controlled atmosphere oven at 450° C. for 2 hours using a ramp-up rate of 3° C./minute.

Figure 2A:
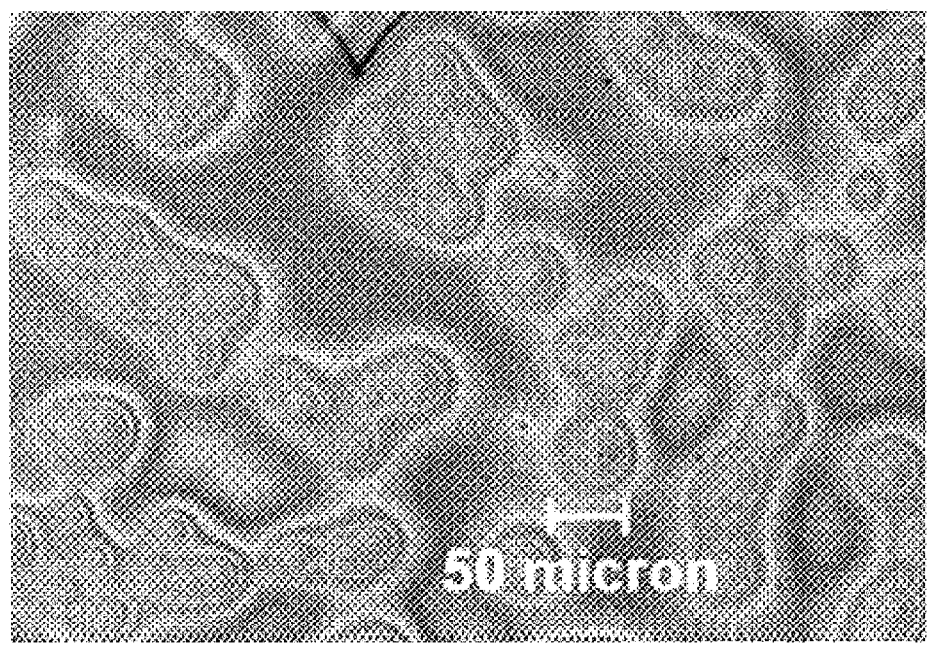
Figure 2B:
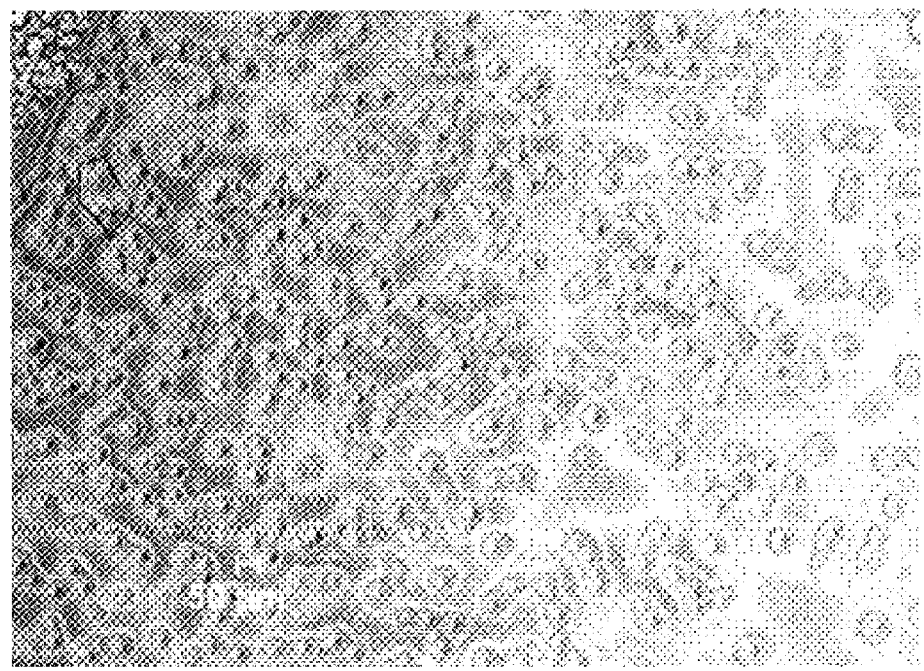
Figure 2C:
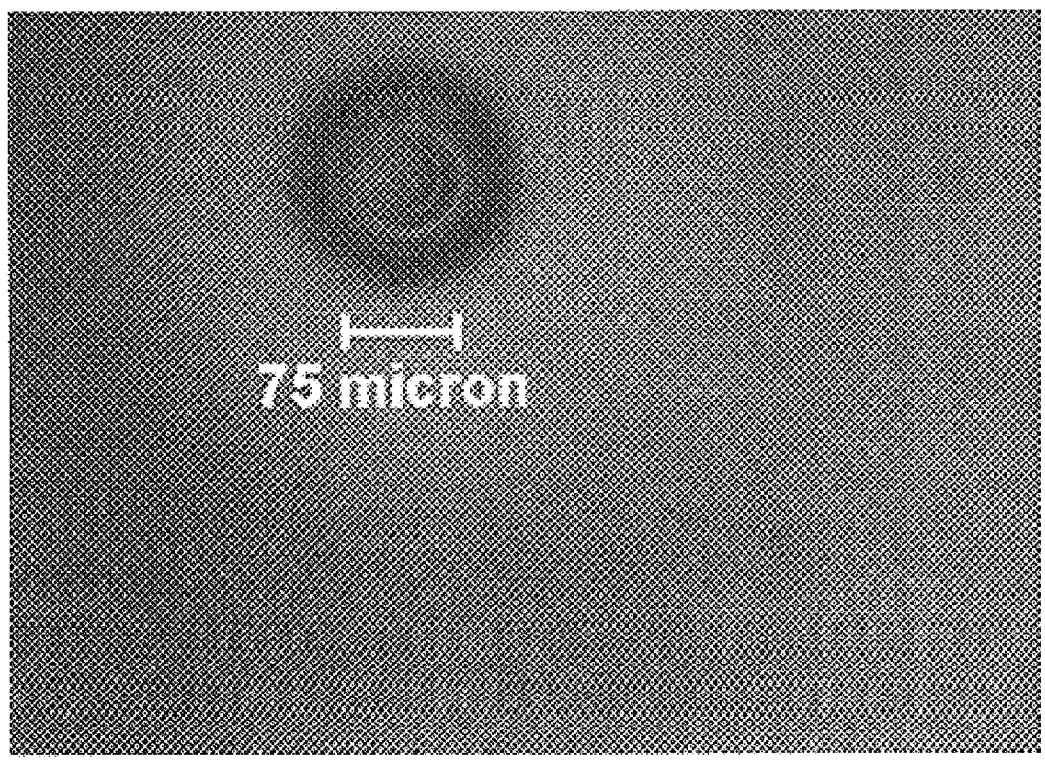

FIG. 1 is a high magnification optical photomicrograph of the coating prepared in part (b), using the method of the invention. As may be seen, the coating is virtually defect-free. By contrast, the optical photomicrographs of the coating prepared in part (a) show substantial defects. FIGS. 2A and 2B are high magnification and low magnification optical photomicrographs, respectively, that illustrate the defects in a coating of the neat MSSQ resin near the edge of the wafer, while FIG. 2C is a high magnification optical photomicrograph illustrating the coating defects at the center of a wafer.

EXAMPLE 2

Viscosity Evaluation

Figure 3:
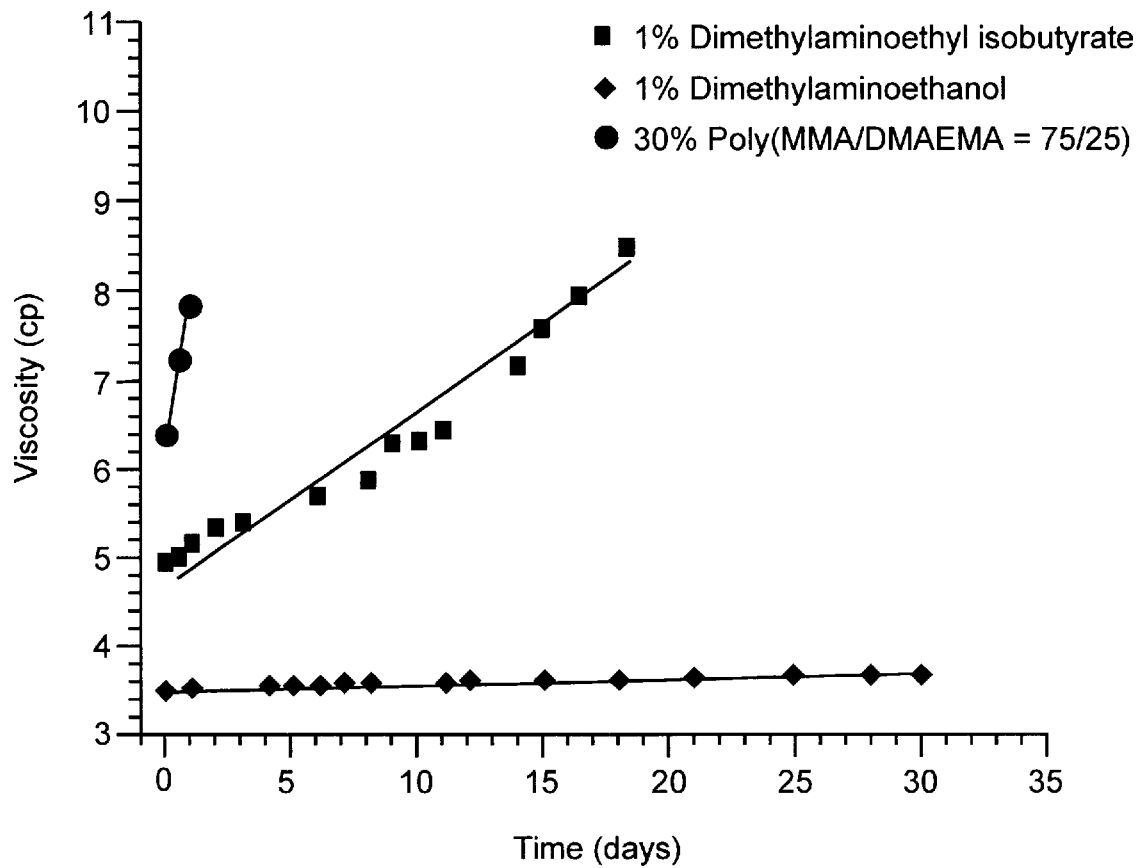
FIG. 3 is a graph illustrating the change in viscosity over time of an MSSQ coating solution containing dimethylamino ethyl isobutyrate, dimethylamino ethanol, and a poly(methyl methacrylate-co-dimethylaminoethyl methacrylate) (poly(MMA-DMAEM)) copolymer as porogens.

Seven gm of a methyl silsesquioxane solution, 18 wt % solids, in PGMEA was mixed with 3.0 gm of a corresponding 18 wt % solution in the identical solvent containing the nitrogenous porogen P(MMA-DMAEM)(3:1 MMA:DMAEM) or an amine-equivalent, low molecular weight material, i.e., dimethylaminoethyl isobutyrate and dimethylaminoethanol. The nitrogenous porogen and the amines represented 1 wt. % based on the MSSQ. The solutions were then introduced into a size 75 calibrated Cannon-Ubbelohde viscometer equipped with an electric timing sensor and provisions to seal the measuring tube in between measurements. The filled viscometer was then placed in a thermostated water bath maintained at 25±0.1° C. Elution times ranged from hours to days, depending on the relative rate of increase in the solution viscosity prior to gelation. Typically, five elution time readings were averaged. The average elution time was then multiplied by the viscometer calibration constant to yield the solution viscosity in centipoise. Results are illustrated in graph form in FIG. 3. As may be seen, with dimethylaminoethanol as the additive, the MSSQ resin gelled within several hours. With dimethylaminoethyl isobutyrate, gelation did not occur as quickly; however, due to the presence of small gel particles, film quality deteriorated within several days. Only the polymeric base, P(MMA-DMAEM), showed very little effect on the MSSQ resin. This was extremely surprising since the basicity of the pendant dimethylaminoethyl group is similar to that of the two low molecular weight bases that were used.

We claim:

1. A method for preparing a substantially defect-free dielectric coating on a substrate surface, comprising:
   (a) admixing (i) a decomposable porogen comprised of a nitrogenous polymer containing a plurality of nitrogenous monomer units, and (ii) a silicon-containing host polymer, in (iii) a casting solvent, wherein the porogen and the host polymer are miscible with respect to each other;
   (b) depositing the admixture prepared in (a) onto a substrate surface to provide a uncured coating thereon;
   (c) heating the uncured coating to a temperature effective to cure the host polymer without decomposing the porogen, thereby converting the uncured coating to a vitrified, two-phase coating comprised of vitrified host polymer and the porogen; and
   (d) decomposing the porogen in the vitrified, two-phase coating.

2. The method of claim 1, wherein the admixture prepared in (a) has a single glass transition temperature $T_g$.

3. The method of claim 1, wherein the porogen is thermally decomposable.

4. The method of claim 3, wherein (d) comprises heating the vitrified, two-phase coating to a temperature effective to decompose the porogen without chemically or physically affecting the host polymer.

5. The method of claim 1, wherein the porogen is photochemically decomposable.

6. The method of claim 5, wherein (d) comprises irradiating the vitrified, two-phase coating with radiation effective to decompose the porogen.

7. The method of claim 1, wherein the porogen is chemically decomposable.

8. The method of claim 7, wherein (d) comprises treating the vitrified two-phase coating with a chemical reagent effective to degrade the porogen.

9. The method of claim 1, wherein the host polymer comprises organic polysilica.

10. The method of claim 9, wherein the organic polysilica is a silsesquioxane.

11. The method of claim 10, wherein the silsesquioxane is selected from the group consisting of hydrogen silsesquioxanes, lower alkyl silsesquioxanes and phenyl silsesquioxanes.

12. The method of claim 11, wherein the silsesquioxane is methyl silsesquioxane.

13. The method of claim 1, wherein the number average molecular weight $M_n$ of the host polymer is in the range of approximately 750 to 100,000.

14. The method of claim 1, wherein the nitrogenous polymer is linear, branched, or crosslinked.

15. The method of claim 14, wherein the nitrogenous polymer is linear.

16. The method of claim 14, wherein the nitrogenous polymer is branched.

17. The method of claim 16, wherein the nitrogenous polymer is hyperbranched or dendritic.

18. The method of claim 14, wherein the nitrogenous polymer is crosslinked.

19. The method of claim 18, wherein the nitrogenous polymer is in the form of a nanoparticle.

20. The method of claim 1, wherein the nitrogenous polymer contains a plurality of nitrogen-containing groups selected from the group consisting of primary amino, secondary amino, tertiary amino, amido, cyano, monocyclic nitrogen-containing heterocycles, bicyclic nitrogen-containing heterocycles, —NH-linkages, and —NR-linkages wherein R is hydrocarbyl, imine linkages, and combinations thereof.

21. The method of claim 1, wherein the nitrogenous polymer is polymerized from at least one monomer selected from the group consisting of: acrylamide; methacrylamide; N,N-dialkyl methacrylamides; acrylonitrile; methacrylonitrile; 2-, 3- and 4-vinyl pyridines; vinyl 2-pyrrolidinone; aminoalkyl methacrylates; N-alkyl aminoalkyl methacrylates; N,N-dialkylaminoalkyl methacrylates; o-, m-, and p-aminostyrenes; and N-alkyl and N-alkylamino-substituted o-, m-, and p-aminostyrenes.

22. The method of claim 1, wherein the nitrogenous polymer is selected from the group consisting of: poly(acrylamide); poly(methacrylamide); N,N-dialkyl poly(acrylamide); N,N-dialkyl poly(methacrylamide); poly(alkoxylated polyamide); poly($\epsilon$-caprolactam); polypropiolactam; polycapryllactam; polylauryllactam; poly(pyrrolidin-2-one); poly(vinylamine); poly(vinyl pyrrolidone); poly(2-vinylpyridine); poly(3-vinylpyridine); poly(4-vinylpyridine); poly(o-aminostyrene); poly(m-aminostyrene); poly(p-aminostyrene); polyethyleneimine; N-alkylated polyethyleneimine; N-acylated polyethylene imine; poly(p-phenylene terephthalamide); polyetherimides; polyimides; polyurethanes; polyhydrazides; polybenzimidazole; poly(1,2,4-triazole); polyhydantoin; polyimidines; and copolymers thereof.

23. The method of claim 1, wherein the nitrogenous polymer is a copolymer of an ethylenically unsaturated non-nitrogenous monomer and a nitrogenous monomer.

24. The method of claim 23, wherein the ethylenically unsaturated non-nitrogenous monomer is selected from the group consisting of alkyl acrylates, aryl acrylates, alkyl methacrylates and aryl methacrylates and the nitrogenous monomer is an N,N-dialkylaminoalkyl methacrylate, and further wherein the ratio of non-nitrogenous monomers to nitrogenous monomers incorporated in the copolymer is in the range of about 1:99 to 99:1.

25. The method of claim 24, wherein the non-nitrogenous monomer is selected from the group consisting of methyl acrylate, methyl methacrylate, n-butyl acrylate, n-butyl methacrylate, t-butyl acrylate, t-butyl methacrylate, 2-ethylhexyl methacrylate, benzyl acrylate and N-phenylacrylamide, and the nitrogenous monomer is N,N-dimethylaminoethyl methacrylate, and further wherein the ratio of non-nitrogenous monomers to nitrogenous monomers incorporated in the copolymer is in the range of about 1:5 to 5:1.

26. The method of claim 25, wherein the non-nitrogenous monomer is methyl methacrylate, and the ratio of methyl methacrylate to N,N-dimethylaminoethyl methacrylate incorporated in the copolymer is in the range of about 1:1 to 5:1.

27. The method of claim 1, wherein the vitrified, two-phase coating prepared in (c) is comprised of approximately 5 vol. % to 95 vol. % porogen.

28. The method of claim 27, wherein the vitrified, two-phase coating prepared in (c) is comprised of approximately 15 vol. % to 95 vol. % porogen.

29. The method of claim 28, wherein the vitrified, two-phase coating prepared in (c) is comprised of approximately 40 vol. % to 95 vol. % porogen.

30. The method of claim 29, wherein the vitrified, two-phase coating prepared in (c) is comprised of approximately 65 vol. % to 95 vol. % porogen.

31. The method of claim 1, wherein the admixture of (a) further includes a crosslinking agent.

32. The method of claim 31, wherein the crosslinking agent and the porogen are present in an approximately 1:1 molar ratio and crosslinking of the porogen and host polymer is effected at a temperature range of about 25° C. to about 150° C.

33. The method of claim 1, further including (e) lithographically patterning the dielectric coating prepared in (d), (f) depositing a metallic film onto the lithographically patterned coating, and (g) planarizing the film to form an integrated circuit.

34. The method of claim 1, wherein the host polymer is cured at a temperature in the range of approximately 150° C. to 250° C.

* * * * *

UNITED STATES PATENT AND TRADEMARK OFFICE
CERTIFICATE OF CORRECTION

PATENT NO.     : 6,685,983 B2
DATED          : February 3, 2004
INVENTOR(S)    : Craig Jon Hawker et al.

It is certified that error appears in the above-identified patent and that said Letters Patent is hereby corrected as shown below:

<u>Title page,</u>
After Item [73], please replace Item [*] Notice, with the following:

-- Subject to any disclaimer, the term of this patent is extended or adjusted under 35 U.S.C. 154(b) by 154 days. --

<u>Column 19,</u>
Line 20, please delete "N-alkyl aminoalkyl" and replace with -- N-alkylaminoalkyl --
Lines 30 and 31, please delete "poly(vinyl pyrrolidone)" and replace with -- poly (vinylpyrrolidone) --

<u>Column 20,</u>
Line 38, please delete "(c)" and replace with -- (e) --
Line 44, please delete the period after "150° C"

Signed and Sealed this

Eighteenth Day of May, 2004

JON W. DUDAS
*Acting Director of the United States Patent and Trademark Office*